United States Patent [19]

Tsukada et al.

[11] Patent Number: 4,482,419

[45] Date of Patent: Nov. 13, 1984

[54] DRY ETCHING APPARATUS COMPRISING ETCHING CHAMBERS OF DIFFERENT ETCHING RATE DISTRIBUTIONS

[75] Inventors: Tsutomu Tsukada; Etsuo Wani; Katsumi Ukai; Teruo Saitoh, all of Tokyo, Japan

[73] Assignee: Anelva Corporation, Tokyo, Japan

[21] Appl. No.: 576,143

[22] Filed: Feb. 2, 1984

[30] Foreign Application Priority Data

Feb. 3, 1983 [JP] Japan .................................. 58-15527

[51] Int. Cl.³ ...................... H01L 21/306; B44C 1/22; C03C 15/00; C23F 1/00
[52] U.S. Cl. .................................. 156/345; 156/643; 204/298
[58] Field of Search ....................... 156/643, 646, 345; 204/192 E, 298

[56] References Cited

U.S. PATENT DOCUMENTS 4,282,077 8/1981 Reavill ............................ 156/345 R
4,341,582 7/1982 Kohman et al. ................... 156/345

Primary Examiner—William A. Powell
Attorney, Agent, or Firm—Laff, Whitesel, Conte & Saret

[57] ABSTRACT

In a dry etching apparatus comprising a plurality of etching chambers each of which comprises a first and a second electrode member opposite to each other, an object is successively etched in each etching chamber, with the object supported on either the first or the second electrode member, under different distributions of etching rate. When the object is placed on the first electrode member in each etching chamber and a gas is introduced through an aperture formed on the second electrode member, each distribution of etching rate can be varied by changing a position of the aperture. A side wall member may be extended from a periphery of the second electrode member towards the first electrode member in each etching chamber to confine plasma within a space defined by the first and the second electrode members and the side wall member. The side wall member is varied in length and/or diameter from an etching chamber to another to realize the different distributions of etching rate. Alternatively, a ring member may be arranged in a space between the first and the second electrode members in each etching chamber. The different distributions are established by changing a distance between the first and the second electrode members from an etching chamber to another. Electric power for the first and the second electrode members may be varied in each etching chamber.

8 Claims, 11 Drawing Figures

DRY ETCHING APPARATUS COMPRISING ETCHING CHAMBERS OF DIFFERENT ETCHING RATE DISTRIBUTIONS

BACKGROUND OF THE INVENTION

This invention relates to a dry etching apparatus of a multi-chamber type for successively etching an object, such as a metal, a semiconductor, an insulator piece.

In general, a dry etching apparatus is superior to a wet etching apparatus in view of delineation of fine etching patterns, facility of operation, and disposal of waste solutions, and is therefore prone to be widely used in semiconductor device fabrication.

A dry etching apparatus of a planar type comprises a plurality of etching chambers arranged along a circle having a predetermined diameter or along a straight line. In addition to the etching chambers, at least one chamber is arranged for entrance and exit of each object. A pair of electrode members are disposed in each etching chamber. Each object is successively etched in the etching chambers with each object placed on one of a pair of electrode members. With the dry etching apparatus of the multi-chamber type, it is possible to consecutively etch a succession of objects with a high productivity. Therefore, such an etching apparatus tends to be widespread for semiconductor device fabrication.

However, it is difficult to obtain excellent uniformity in etching characteristics. This is because an etching rate has a nonuniform distribution in each etching chamber. The nonuniform distribution does not substantially vary from one etching chamber to another. In addition, electric power is wasted by the electrode members because each etching chamber has a useless space which is not contributive to etching operation. Therefore, the etching rate is comparatively low for the electric power consumed by the etching apparatus.

SUMMARY OF THE INVENTION

It is therefore a general object of this invention to provide a multi-chamber dry etching apparatus which is capable of obtaining uniform etching characteristics on each object.

It is a specific object of this invention to provide a multi-chamber dry etching apparatus of the type described, which is capable of accomplishing a high etching rate.

A dry etching apparatus to which this invention is applicable, comprises first and second etching chamber groups, each of which comprises an etching chamber comprising a first and a second electrode member having a first and a second principal surface, respectively. The first and the second principal surfaces oppose each other. The first and the second etching chamber groups are for successively etching an object placed on a predetermined one of the first and the second principal surfaces in each etching chamber with different distributions of etching rate on the predetermined ones of the first and the second principal surfaces in the etching chambers of the respective etching chamber groups.

DESCRIPTION OF THE PREFERRED EMBODIMENTS

Figure 1:
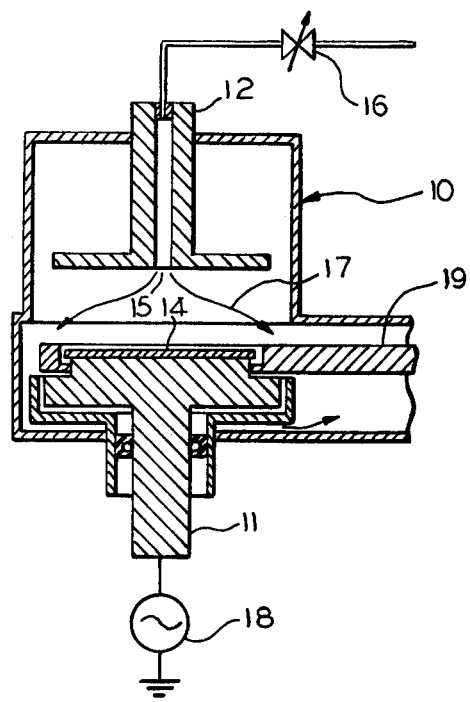
FIG. 1 is a schematic vertical sectional view of one etching chamber of a conventional dry etching apparatus of a multi-chamber type.

Referring to FIG. 1, a conventional dry etching apparatus of a multi-chamber type will be described at first for a better understanding of this invention. The dry etching apparatus comprises a plurality of etching chambers which are azimuthally spaced from one another. Only one chamber is shown at 10 in FIG. 1 as a representative of the etching chambers.

Each etching chamber 10 defines a hollow space coupled to one another through an intermediate space. First and second electrode members 11 and 12 are disposed in the etching chamber 10. The first electrode member 11 has a first principal surface directed upwardly of FIG. 1. The first principal surface is for placing an object 14, such as a semiconductor substrate thereon. The second electrode member 12 has a second principal surface opposite and substantially parallel to the first principal surface.

The second electrode member 12 has an aperture 15 at the center of the second principal surface. A gas pipe is attached to the second electrode member 12 and extended upwardly of the figure through a top wall of the etching chamber 10 to be coupled to a gas control valve 16. An etching gas is introduced into the etching chamber 10 through the gas control valve 16, the gas pipe, and the aperture 15. Therefore, a combination of the gas pipe and the aperture 15 may be called a gas introducing member. The etching gas can be exhausted through a common exhaust pipe (not shown) which is attached to the right side of the etching chamber 10.

It should be noted here that each aperture 15 is positioned at a center portion of each second principal surface of the second electrode members 12 placed in the respective etching chambers 10. A typical flow of the etching gas is illustrated by solid-line curves collectively indicated at 17.

An electric power source 18 of a radio frequency is for supplying a radio frequency electric voltage to the first electrode member 11. The second electrode member 12 is grounded. The radio frequency electric voltage causes a gas discharge to occur between the first and the second electrode members 11 and 12. The object 14 is moved from one etching chamber to the other by indexing a holder 19.

The object 14 is successively etched in the respective etching chambers. An etching rate in each etching chamber 10 is dependent on the gas flow 17. Inasmuch as the gas flow 17 is not uniformly brought into contact with the object 14 and the aperture 15 is placed at the center portion of each second principal surface of the second electrode members 12, the etching rate has a nonuniform distribution in each etching chamber. The distribution does not substantially vary from one etching chamber to another. Accordingly, the object 14 is nonuniformly etched after passing through all of the etching chambers 10.

Figure 2:
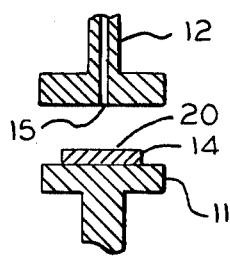
FIG. 2 is a schematic vertical sectional view of a pair of electrodes in an etching chamber for describing a principle of this invention.
Figure 3:
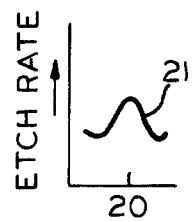
FIG. 3 shows an etching rate distribution across an object in the etching chamber exemplified in FIG. 2.

Referring to FIGS. 2 through 7, a principle of this invention will be outlined. In FIG. 2, the aperture 15 is formed at the center portion of the second principal surface of the second electrode member 12. The aperture 15 is placed over the first electrode member 11 so that a center 20 of the object 14 is in register with the aperture 15. In this event, the etching rate is symmetrically reduced as a distance becomes long from the center of the object 14. As a result, the distribution of the etch rate has a maximum value at the center 20 of the object 14, as shown at a curve 21 in FIG. 3, and is nonuniform.

If the object 14 is etched in every etching chamber 10 under such a nonuniform distribution of etch rate, like in the conventional dry etching apparatus illustrated in FIG. 1, uniform etching can not be achieved, as pointed out in the preamble of the instant specification.

Figure 4:
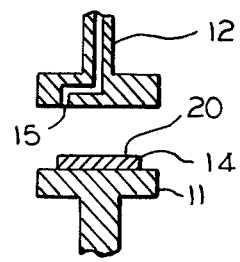
FIG. 4 is a schematic vertical sectional view of a pair of electrodes in an etching chamber, for describing a principle of this invention.
Figure 5:
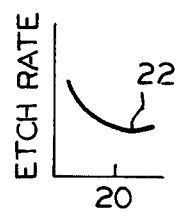
FIG. 5 shows an etching rate distribution for the chamber of FIG. 4.

In FIG. 4, the aperture 15 is displaced from the center of the object 14. The illustrated aperture 15 is opposite to a peripheral portion of the object 14. This reduces the etching rate at the center 20. The distribution of the etch rate is specified by a curve 22, as shown in FIG. 5, and reduces in an asymmetrical manner with respect to the center of the object 14. As is apparent from the curve 22, the etch rate is very low at the center 20 of the object 14. This means that the variation of the distribution is counterbalanced when the second electrode member 12 illustrated in FIG. 2 is combined with that illustrated in FIG. 4.

Figure 6:
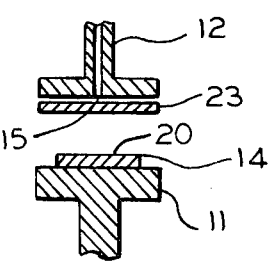
FIG. 6 is a schematic vertical sectional view of a pair of electrodes in an etching chamber for describing a principle of this invention.

In FIG. 6, a gas disturbing plate 23 is disposed under the second principal surface of the second electrode member 12. The plate 23 is adjacent to the second principal surface. The etching gas is introduced through the aperture 15 into the hollow space and is scattered towards the periphery of the second principal surface through a space between the second principal surface and the gas disturbing plate 23.

Figure 7:
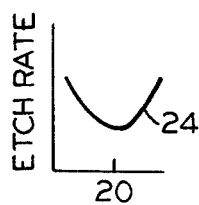
FIG. 7 shows an etching rate distribution for the chamber of FIG. 6.

In FIG. 7, a curve 24 shows an etching rate distribution in the case of FIG. 6. In the etching rate distribution 24, etching rate at the center 20 of the object 14 is smallest. The etching rate increases on approaching the periphery of the object 14.

As described above, the etching rate distribution of the object 14 varies in accordance with the position of the aperture 15 or the shape of the gas disturbing plate 23. It is therefore possible to obtain uniform etching characteristics on each object by preparing a plurality of etching chambers having gas emitting means which are different from each other so as to substantially uniformly etch each object when the object passes through the etching chambers.

Figure 8:
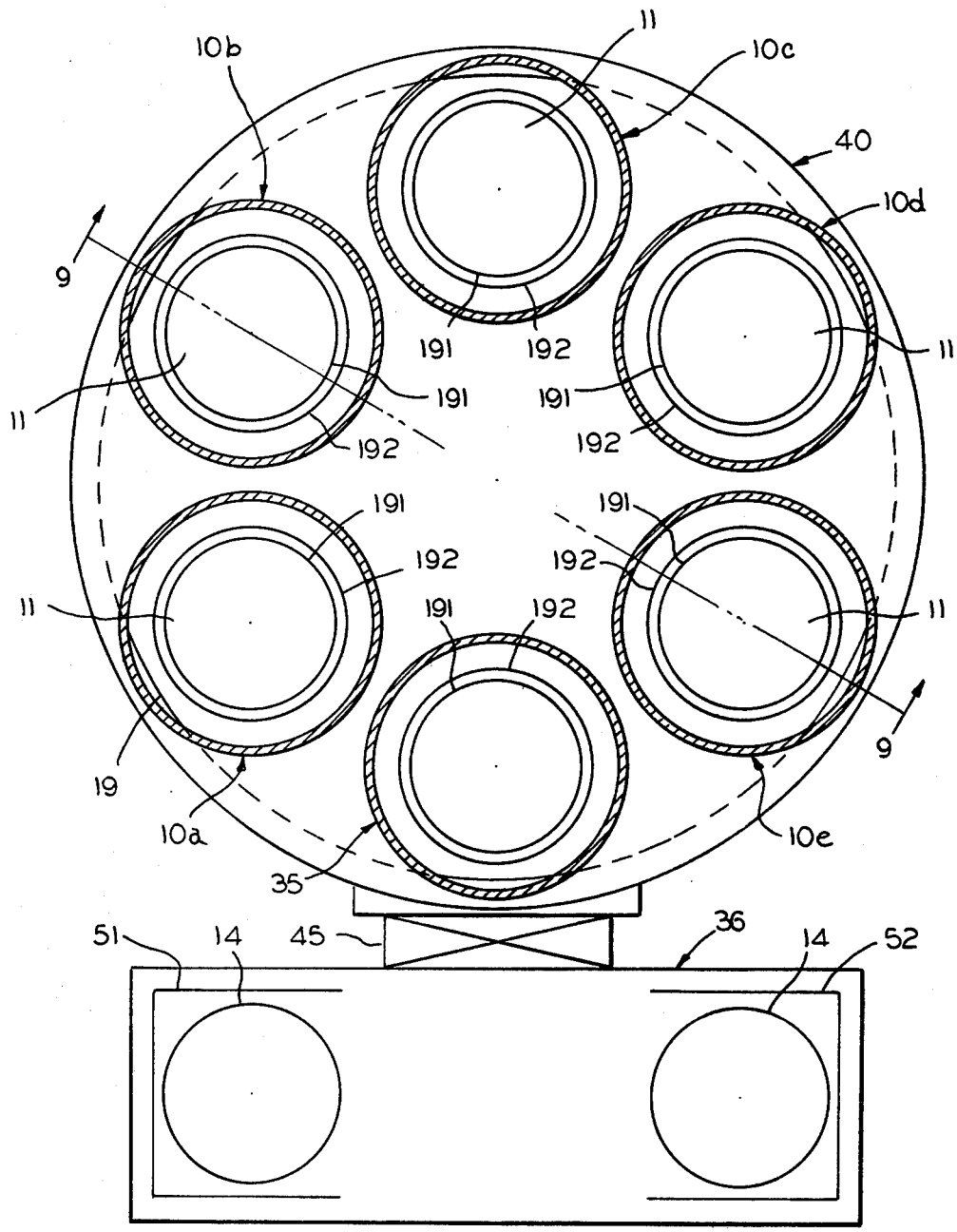
FIG. 8 is a schematic partially cut-away view of an etching apparatus according to a first embodiment of the instant invention.
Figure 9:
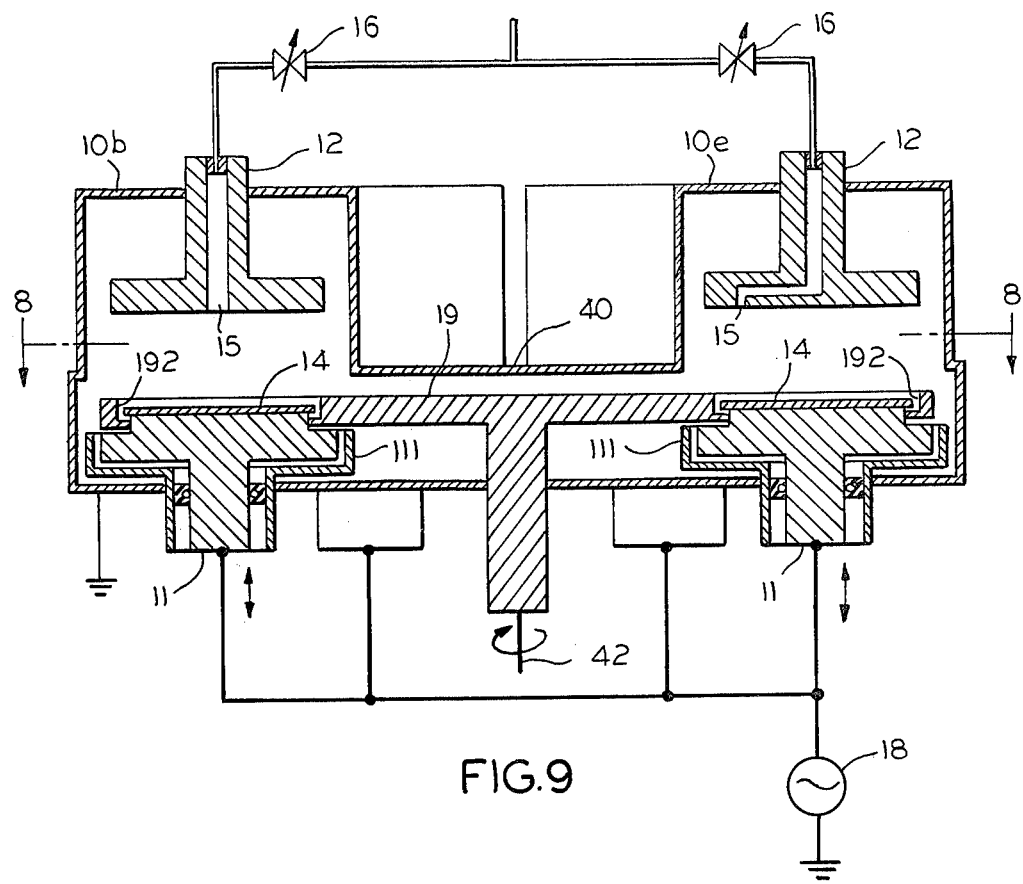
FIG. 9 is a schematic vertical sectional view taken along a line 9—9 of FIG. 8.

Referring to FIGS. 8 and 9, a dry etching apparatus according to a first embodiment of this invention comprises first through fifth etching chambers depicted at 10a to 10e each of which is similar to the etching chamber 10 illustrated in FIG. 1. In addition, the dry etching apparatus comprises an object exchanging chamber 35 selectively serving as an entrance and an exit of untreated and treated objects both of which are depicted at 14 in an object storing chamber 36, respectively. As illustrated in FIG. 8, each of the first through the fifth etching chambers 10a to 10e and the object exchanging chamber 35 is azimuthally spaced apart from each other at an angle of 60° and is of a cylindrical cross section. The first through the fifth etching chambers 10a to 10e and the object exchanging chamber 35 are coupled to one another through a base vessel 40 having a cylindrical shape and a center axis as shown at 42 in FIG. 9. It is to be noted here that the object exchanging chamber 35 can selectively be isolated from the first through the fifth etching chambers 10a to 10e by means of an internal valve (not shown) in a known manner. The internal valve may be called a lock valve.

In FIG. 8, the object storing chamber 36 is coupled to the base vessel 40 through a gate valve 45 and serves to accommodate first and second cassettes 51 and 52 for storing the untreated and the treated objects 14, respectively. Each of the cassettes 51 and 52 is movable in a direction perpendicular to a plane defined by the sheet of FIG. 8. Each untreated object is sent from the first cassette 51 to the object exchanging chamber 35 through the gate valve 45 while each treated object is taken out of the object exchanging chamber 35 and held in the second cassette 52. The untreated and the treated objects 14 are exposed to the atmosphere in the object storing chamber 36.

Let a particular one of the untreated objects 14 be sent from the object storing chamber 36 to the object exchanging chamber 35. In this event, the particular untreated object is moved from the object exchanging chamber 35 to the first etching chamber 10a and thereafter successively moved from the first etching chamber 10a to the other etching chambers by indexing a holder 19. As best shown in FIG. 9, the holder 19 is arranged in the base chamber 40 and has a holder axis in register with the center axis 42 of the vessel 40 to be rotatable around the holder axis. The holder 19 has six circular openings (collectively shown at 191) each of which has a diameter slightly shorter than that of each object. Each opening 191 is bored to each of six circular recesses 192 of the holder 19. A diameter of each recess 192 is slightly larger than that of each object 14.

In FIG. 9, it is assumed that the particular untreated object 14 is placed on the first electrode member 11 in the second etching chamber 10b while a specific one of the treated objects 14 is placed on the first electrode member 11 in the fifth etching chamber 10e. As illustrated in FIG. 9, the second electrode member 12 in the second etching chamber 10b has an aperture 15 positioned at a center of the second principal surface. The aperture 15 is opposed to a center portion of the first principal surface in the second etching chamber 10b. On the other hand, the second electrode member 12 in the fifth etching chamber 10e has an aperture 15 situated on the second principal surface at a position offset from a center of the second principal surface. Therefore, the distributions of etching rate on the first principal surfaces in the second and the fifth etching chambers 10b and 10e are different from each other. Likewise, the distributions of etching rate in all of the etching chambers 10a to 10e are different from one another so as to substantially uniformly etch each object 14 when the object 14 passes through all of the etching chambers 10a to 10e. In FIG. 9, a shield 111 serves to avoid any gas discharge on a rear surface of each first electrode member 11.

The movement of the object in the dry etching apparatus according to the first embodiment of this invention will be described hereinafter. In FIGS. 8 and 9, the particular untreated object 14 is carried from the first cassette 51 into the object exchanging chamber 35 through the gate valve 45 by a known transfer mechanism, which may be a belt, a fork, and so on. A support is placed in the object exchanging chamber 35 and similar to each first electrode members 11 placed in the respective etching chambers 10a to 10e. No second electrode member 12 is necessary in the object exchanging chamber 35. The object exchanging chamber 35 is isolated from the vessel 40 by the lock valve mentioned before. The particular untreated object 14 is carried into the object exchanging chamber 35 to be positioned in register with the recess 192 of the holder 19. Under the circumstances, the gate valve 45 is closed. The object exchanging chamber 35 is exhausted by a vacuum pump (not shown). When vacuum in the object exchanging chamber 35 reaches to a predetermined degree, the lock valve is opened.

In the following step, the support in the object exchanging chamber 35 is moved downwards of FIG. 9 together with the first electrodes 11 placed in the respective etching chambers. The particular untreated object is brought into contact with the recess of the holder 19 placed in the object exchanging chamber 35. Thereafter, the holder 19 is rotated by 60°. As a result, the particular untreated object is transferred from the object exchanging chamber 35 onto the first electrode member 11 in the first etching chamber 10a. Under the circumstances, the first electrodes 11 are simultaneously moved upwards to be kept out of contact with the holder 19. Thus, the particular untreated object 14 is sent from the object exchanging chamber 35 to the first etching chamber 10a.

Concurrently, the specific treated object 14 is moved from the fifth etching chamber 10e to the object exchanging chamber 35 and is transferred to the second cassette 52 through the gate valve 45 in a manner known in the art.

The particular untreated object 14 is etched into an etched object in the first etching chamber 10a under a distribution of etching rate dependent on the position of the aperture 15 in the first etching chamber 10a.

Subsequently, the etched object is transferred from the first etching chamber 10a to the second etching chamber 10b by indexing the holder 19 to be subjected to etching in the second etching chamber 10b in another distribution of etching rate which is different from that in the first etching chamber 10a. Such a difference between the distributions is given by radially displacing the positions of the apertures 15 from each other in the first and the second etching chambers 10a and 10b. Thereafter, the etched object is successively moved from the second etching chamber 10b eventually to the fifth etching chamber 10e through the third and the fourth etching chambers 10c and 10d with etching operation carried out in each etching chamber under different distributions. Thus, the particular untreated object 14 is etched stepwise in each etching chamber.

With this structure, the distributions of etching rate are varied relative to one another. In other words, the distributions in the respective chambers 10a to 10e have maxima positioned differently from one another so that each object 14 is uniformly etched throughout the first through the fifth etching chambers 10a to 10e.

The fifth etching chamber 10e may be used for overetching if completion of etching is detected in the fourth etching chamber 10d in which a detector (not shown) is provided to detect an end of point of etching.

If the end point of etching is detected at every object in either the fourth etching chamber 10d or the fifth etching chamber 10e, it is possible to accurately control the end point of etching. It is furthermore possible to rotate the first electrode members 11 in each etching chamber around a center axis thereof. This reduces the number of different distributions of etching rate in the respective etching chambers.

Although the illustrated dry etching apparatus comprises the first through the fifth etching chambers 10a to 10e, at least two etching chamber groups may be included in the dry etching apparatus. In other words, the dry etching apparatus may comprise first and second etching chamber groups each of which comprises at least one etching chamber and provides a distribution of etching rate different from the other.

Figures 10, 11:
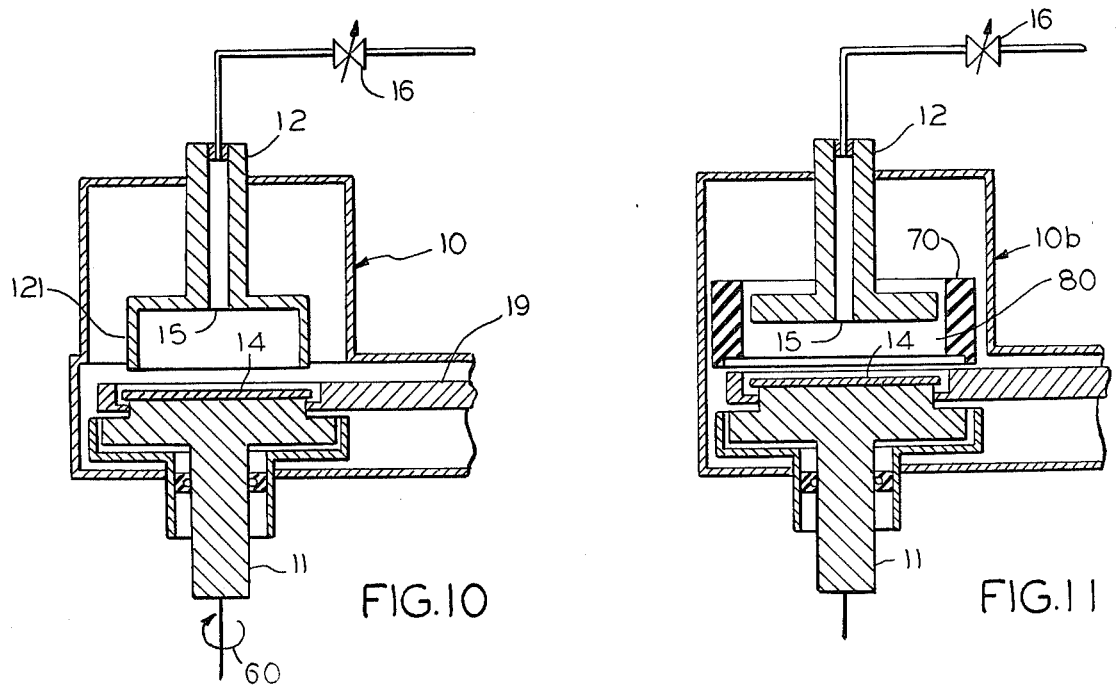
FIG. 10 is a schematic vertical sectional view of an etching chamber of an etching apparatus according to a second embodiment of this invention.
FIG. 11 is a schematic vertical sectional view of an etching chamber of an etching apparatus according to a third embodiment of this invention.

Referring to FIG. 10, an etching apparatus according to a second embodiment of this invention comprises a plurality of etching chambers as described with reference to FIGS. 8 and 9. A single chamber alone is shown at 10 in FIG. 10 as a representative of the etching chambers. Each second electrode member 12 of the etching chambers comprises a side wall 121 extending from a periphery of the second principal surface thereof towards the first electrode member 11. The plasma is confined in a restricted space defined by the first principal surface of the first electrode member 11, the second principal surface of the second electrode member 12, and the side wall 121, when the radio frequency voltage is supplied to the first electrode member 11 with the second electrode member 12 grounded. The first electrode member 11 is rotatable around a center axis thereof, as shown at an arrow 60. It is therefore possible to accomplish a high etching rate as compared with the apparatus illustrated with reference to FIGS. 8 and 9.

Further, it has been found that the distribution of etching rate widely varies on the first principal surface of the first electrode member 11 according to the position at which the aperture 15 is situated on the second principal surface of the second electrode member 12. The distribution of etching rate on the first principal surface exhibits a high etching rate at that part which faces the aperture 15. The etch rate is very slow at the surroundings of that part. Furthermore, each distribution of etching rate depends upon not only the position of the aperture 15 but also an inside and/or a length of the side wall 121. Therefore, each object can uniformly be etched with a high productivity, by arranging various etching chambers which are different as regards the position of the aperture 15 of the second principal surface, the inside diameter or the length of the side wall 121. The first electrode member 11 may be turned around its own axis, as described in conjunction with FIGS. 8 and 9.

Referring to FIG. 11, a dry etching apparatus according to a third embodiment of this invention comprises a plurality of etching chambers like the apparatus according to the first embodiment. A single chamber alone is shown at 10b as a representative of the etching chambers. A ring-shaped side wall member 70 is placed in the illustrated etching chamber 10b along a periphery of the second electrode member 12 and extended towards the first electrode member 11. This is similar to the other etching chambers. The ring member 70 may be made of an insulator, such as a polymer of tetrafluoroethylene manufactured by Du Pont and known by a trade name Teflon, a quartz, or a metal, such as aluminum. Like in FIG. 10, the plasma is confined in a restricted space defined by the first and the second principal surfaces of the first and the second electrode members 11 and 12 and the ring member 70, when the radio frequency voltage is supplied to the first electrode member 11 with the second electrode member 12 grounded. It is therefore possible to accomplish a high etching rate like in the apparatus according to the second embodiment.

Let the ring member 70 be made of metal and be insulated from each of the first and second electrodes 11 and 12. In this event, a d.c. voltage may be applied to each of the metal ring member 70 with a radio frequency voltage given between the first and the second electrode members 11 and 12. The etching rate can be controlled in each etching chamber 10 by the d.c. voltage applied to the metal ring member 70. Furthermore, the distribution of etching rate can be varied in each etching chamber from another by varying the d.c. voltage applied to the metal ring member 70.

It is assumed that the ring member 70 is of either a metal or an insulator material and is isolated from the first and the second electrode members 11 and 12 and the etching chamber 10b. Under the circumstances, let supply of a radio frequency voltage cause the plasma to occur in the restricted space defined by the first and the second principal surfaces and the ring member 70. In this event, the ring member 70, is brought into contact with the plasma to be kept at a potential near to the plasma potential known in the art. When such a ring member 70 is adjacent to the first and the second electrode members 11 and 12 and when each of the first and the second electrode members 11 and 12 has an area substantially equal to the other, a potential of the first electrode member 11 is rendered substantially equal to that which the second electrode member 12 has relative to the plasma potential. This means that an etching characteristic on the first principal surface becomes similar to that on the second principal surface because accelerated ions have substantially equal energy on both of the first and the second principal surfaces. In other words, the same etching characteristic can be achieved even when the radio frequency voltage is supplied to whichever one of the first and the second electrode members 11 and 12 with the other electrode member grounded. It is to be noted in this connection that an electrode member should be handled with a great care when the electrode member under consideration is supplied with the radio frequency voltage and that the first electrode member 11 is intricate in structure as compared with the second electrode member 12. Taking the above into consideration, each object is etched on the first electrode member 11 in the illustrated dry etching apparatus with the radio frequency voltage supplied to the second electrode member 12 rather than to the first electrode member 11 as thus far been described. Therefore, the dry etching apparatus can be handled with ease and can etch object at a high etching rate like the apparatus according to the first embodiment of this invention illustrated in FIGS. 8 and 9.

Moreover, it is possible to vary a distribution of etching rate by changing a distance between the first and the second electrode members 11 and 12. At any rate, the distributions of etching rate can be varied with this structure.

While the present invention has thus far been described in conjunction with a few preferred embodiments thereof, it will now be possible for those skilled in the art to practice this invention in various other manner. For example, a plurality of the etching chambers 10 may be arranged along a straight line. A chamber for entrance of each object may be independent of a chamber for exit of each object. In order to place the object 14 on the first principal surface of the first electrode 11, it is possible to move the holder 19 downwardly of FIG. 9 instead of moving the first electrode member 11 upwardly. The object exchanging chamber 40 may be omitted from the apparatus illustrated in FIG. 8. Instead, it is possible to exchange all of the objects 14 in all of the etching chambers 10 by manual operation whenever a batch of the objects 14 are finished etching.

It is possible to divide a plurality of the etching chambers 10 into at least two groups and to provide an electric power source 18 of a radio frequency corresponding to each of the groups. Distributions of etching rate can be varied on the first principal surfaces of the first electrode members 11 from one group to another group, by varying the power or the frequency of each individual electric power source at every group.

The radio frequency voltage may be supplied to the first electrode members 11 placed in selective ones of the respective etching chambers and to the second electrode members 12 placed in the remaining etching chambers.

What is claimed is:

1. A dry etching apparatus comprising first and second etching chamber groups, each of which comprises an etching chamber comprising a first and a second electrode member having a first and a second principal surface, respectively, said first and said second principal surfaces opposing each other, said first and said second etching chamber groups being for successively etching an object placed on a predetermined one of the first and the second principal surfaces in each etching chamber with different distributions of etching rate on the predetermined ones of the first and the second principal surfaces in the etching chambers of the respective etching chamber groups.

2. A dry etching apparatus as claimed in claim 1, the predetermined ones of the first and the second principal surfaces being of the first electrode members, wherein:
the second electrode member of each etching chamber of said first etching chamber group comprises first gas emitting means for emitting a gas from a predetermined portion of the second principal surface thereof towards the opposing first principal surface;
the second electrode member of each etching chamber of said second etching chamber group comprising second gas emitting means for emitting said gas from a preselected portion of the second principal surface thereof towards the opposing first principal surface, said preselected portion being situated on the second principal surface at a position offset as compared with a position at which said predetermined portion is situated on the second principal surface.

3. A dry etching apparatus as claimed in claim 2, wherein each second electrode member of the etching chamber of each etching chamber group comprises a side wall extending from a periphery of the second principal surface thereof.

4. A dry etching apparatus as claimed in claim 3, wherein said side wall in the etching chamber of said first etching chamber group is different in length from that in the etching chamber of said second etching chamber group.

5. A dry etching apparatus as claimed in claim 4, wherein the second principal surface of the etching chamber of said first etching chamber group is different in area from that of the etching chamber of said second etching chamber group.

6. A dry etching apparatus as claimed in claim 2, comprising a ring member arranged in a space between the first and the second principal surfaces of the etching chamber of each etching chamber group with said ring member electrically insulated from the first and the second electrode members of the etching chamber of each etching chamber group.

7. A dry etching apparatus as claimed in claim 6, the first and the second electrode members of the etching chamber of each etching chamber group being laid with a distance left therebetween, wherein the distance of the etching chamber of said first etching chamber group being narrower than that of the etching chamber of said second etching chamber group.

8. A dry etching apparatus as claimed in claim 1, wherein:
the etching chamber of said first etching chamber group comprises first power supply means for supplying first electric power between the first and the second principal surfaces of the first and the second electrode members thereof;
the etching chamber of said second etching chamber group comprising second power supply means for supplying second electric power between the first and the second principal surfaces of the first and the second electrode members thereof, said second electric power being different from said first electric power.

* * * * *